United States Patent [19]
Sze

[11] Patent Number: 6,092,231
[45] Date of Patent: Jul. 18, 2000

[54] CIRCUIT AND METHOD FOR RAPID CHECKING OF ERROR CORRECTION CODES USING CYCLIC REDUNDANCY CHECK

[75] Inventor: Hung Y. Sze, La Habra, Calif.

[73] Assignee: QLogic Corporation, Aliso Viejo, Calif.

[21] Appl. No.: 09/096,709

[22] Filed: Jun. 12, 1998

[51] Int. Cl.[7] .................................................. G11B 20/18
[52] U.S. Cl. ............................................ 714/758; 714/769
[58] Field of Search ..................................... 714/758, 769

[56] References Cited

U.S. PATENT DOCUMENTS

| | | | |
|---|---|---|---|
| 3,800,281 | 3/1974 | Devore et al. | 340/146.1 |
| 4,881,232 | 11/1989 | Sako et al. | 371/37.4 |
| 4,949,342 | 8/1990 | Shimbo et al. | 371/37 |
| 5,027,357 | 10/1992 | Yu et al. | 371/37.7 |
| 5,068,857 | 11/1991 | Yoshida | 371/37.7 |
| 5,136,592 | 8/1992 | Weng | 371/39.1 |
| 5,157,669 | 10/1992 | Yu et al. | 371/37.7 |
| 5,361,266 | 11/1994 | Kodama et al. | 371/37.7 |
| 5,491,701 | 2/1996 | Zook | 371/39.1 |
| 5,563,896 | 10/1996 | Nakagushi | 317/37.1 |
| 5,581,715 | 12/1996 | Verinsky et al. | 395/309 |
| 5,592,404 | 1/1997 | Zook | 364/746.1 |
| 5,600,662 | 2/1997 | Zook | 371/40.1 |
| 5,602,857 | 2/1997 | Zook et al. | 371/40.1 |
| 5,629,949 | 5/1997 | Zook | 371/37.1 |
| 5,691,994 | 11/1997 | Acosta et al. | 371/40.1 |
| 5,991,911 | 11/1999 | Zook | 714/758 |

*Primary Examiner*—Stephen M. Baker
*Attorney, Agent, or Firm*—Knobbe, Martens, Olson & Bear, LLP

[57] ABSTRACT

A circuit and method use a cyclic redundancy check (CRC) unit to check any errors detected by an error correction code (ECC) unit when reading a sector of bytes from a disk in a disk drive. The CRC unit reads the sector of bytes from the disk simultaneously with the ECC unit. The CRC unit begins generating a residue to detect errors in the sector of bytes at approximately the same time the ECC unit begins generating a residue to detect errors in the sector. The CRC unit does not wait for the ECC unit to finish correcting the sector and transfer the ECC error corrections into a buffer memory before generating a CRC residue. The CRC unit monitors both the sector of bytes read from the disk platter and any errors detected by the ECC unit in the data and CRC bytes, without reading the contents of the buffer unit. The CRC unit uses the error locations and error values found by the ECC unit to determine whether the ECC-corrected bytes stored in a buffer unit were properly corrected. The CRC unit compares any errors detected by the ECC unit with any errors detected by the CRC unit. If the errors detected by the CRC unit do not match the errors detected by the ECC unit, then the CRC unit causes the disk drive to discard the sector of bytes and attempt to reread the same sector from the disk. The CRC error check is completed before any data is transferred to the host computer. The CRC unit must approve of the data before the disk drive controller sends the data to the host. The ECC unit may begin to process another sector of data while the CRC unit is comparing any errors detected by the ECC unit with any errors detected by the CRC unit.

20 Claims, 6 Drawing Sheets

CIRCUIT AND METHOD FOR RAPID CHECKING OF ERROR CORRECTION CODES USING CYCLIC REDUNDANCY CHECK

FIELD OF THE INVENTION

The present invention relates generally to computers. Specifically, the present invention relates to a circuit and method for improving the accuracy and speed of error detection and correction in disk drives.

BACKGROUND OF THE INVENTION

A conventional disk drive stores data bytes on disk drive platters in sets of a predetermined length. A disk drive controller or a host computer may generate error correction code (ECC) bytes and cyclic redundancy check (CRC) bytes for each set of data bytes. Sometimes, the host computer generates CRC bytes, and the disk controller generates its own set of CRC bytes. The CRC and the ECC bytes are appended to the end of the set of data bytes. The data bytes, CRC bytes and ECC bytes together make up a 'sector', and this sector is stored on the disk platter. When the disk drive controller reads a sector off the disk, the data bytes and CRC bytes are stored in a buffer unit (memory) in the disk drive. An ECC unit detects and corrects errors in the sector read off the platter. These corrections are made to the data bytes and CRC bytes stored in the buffer unit.

The ECC unit may, however, fail to detect one or more errors in the data and CRC bytes read off the disk when there is actually is an error. If the ECC unit misses an error, it will also fail to correct the data and CRC bytes to their original values before the data bytes are sent to the host computer. Another miscorrection situation is where the ECC unit detects a true error but fails to correct the erroneous byte(s) properly. Both of these situations are miscorrections. Disk drives with ECC units that have higher error detection and correction capabilities experience a higher probability of miscorrection and failed corrections.

After the ECC unit makes corrections (or miscorrections) to the data and CRC bytes stored in the buffer unit, the disk drive controller reads the contents of the buffer and transfers these contents across a bus to a host computer. For example, the bus may be a Small Computer Systems Interface (SCSI) bus. As the data is being transferred, a CRC check unit in some disk drives accumulates the 'corrected' data bytes as they are being transferred to the host, generates a CRC residue, and checks for any miscorrections or failed corrections by the ECC unit. The CRC check unit does not complete its analysis on whether the transferred data contains any miscorrections or failed corrections until after the data transfer to the host computer is complete. After an incorrect data transfer to the host is complete, the CRC check unit sends an error message to the host computer if the data the host computer received contains miscorrections and/or failed corrections. The host computer must discard the erroneous data bytes and send a request to the disk drive to reread the data bytes from the disk platter and retransmit the data bytes to the host computer.

This is inefficient because during the time that the host computer receives the erroneous data, receives a message from the CRC check unit, requests the disk drive controller to retransmit the data, and waits for new data to be read and transferred, the host computer could be doing some other task. This is also inefficient because the transmissions, retransmissions and CRC check messages take up bandwidth on the SCSI bus.

Furthermore, there is a detrimental impact on performance on the host side. Some host computers, interfaces and/or software applications cannot process the incorrect data. This may result in breakdowns in applications currently being run by the host computer. Some host computers can process incorrect data but they cannot recover quickly, and this causes undesirable delays.

SUMMARY OF THE INVENTION

The present invention provides a circuit and method for improving the accuracy and speed of error detection and correction when reading a sector of bytes from a disk in a disk drive. The present invention uses a CRC unit to monitor both the sector bytes read from the disk platter and any errors detected by the ECC unit in the data and CRC bytes of the sector. The CRC unit uses this information to determine whether the ECC-detected errors are correct. If the errors detected by the ECC unit do not match the errors detected by the CRC unit, the CRC unit causes the disk drive to discard the sector of bytes and attempt to reread the same sector from the disk.

In contrast to the conventional approach, the CRC unit in the present invention reads data bytes and CRC bytes directly from the disk simultaneously with the ECC unit. Thus, the CRC unit begins generating a residue to detect errors in the data at approximately the same time the ECC unit begins generating a residue to detect errors in the sector. This saves significant time because the CRC unit in the present invention does not wait for the ECC unit to finish and transfer the ECC error corrections into a buffer, and then read the corrected data from the buffer. The present device and method eliminates the time spent by a CRC unit reading all the corrected data and CRC bytes from a buffer memory and generating a CRC residue after an ECC unit has finished its attempted corrections.

In the present device and method, the ECC unit may begin processing a second sector of information from the disk platter as soon as the ECC unit stores the locations and values of any errors found in the first sector into an error location and value memory module. Thus, the ECC unit does not have to wait until the CRC unit is done comparing errors found by the ECC unit and the CRC unit before beginning to process a second sector. The ECC unit does not have to wait until the CRC unit is finished with reconciliation and the CRC unit does not have to wait for the ECC unit to finish generating a residue. This results in an efficient, continuous, 'real time' read operation in the disk drive.

Another advantage of the present invention is that the circuit and method completes a CRC error check before any data is transferred to the host computer. In other words, the CRC unit must approve the data before the disk drive controller sends the data to the host.

There are at least four situations where the disk drive controller should abort the current read operation and attempt another read operation of the same sector. In one situation, the ECC unit detects an uncorrectable error in the data read from the disk. In another situation, the ECC unit 'detects' one or more correctable errors, and the CRC unit does not detect any errors. This is a misdetection. If the ECC unit tries to correct this data, then a miscorrection occurs. In another situation, the ECC unit does not detect any errors, and the CRC unit does detect errors. This is a failed detection. In another situation, both the CRC unit and the ECC unit detect at least one error, but the detected errors are not the same. In all of these situations, the CRC unit of the present invention informs the disk drive controller. The disk drive controller aborts the read operation, discards the entire read sector, and prevents the erroneous data from being transmitted to the host. The disk drive controller attempts another read operation of the same data sector off the disk.

Thus, the CRC unit and disk drive controller of the present invention reduce the amount of erroneous data sent to the host computer. This avoids the problem of the host trying to process the erroneous data, which could result in breakdowns, software application errors and undesirable delays. The present invention also eliminates the time spent by the host on discarding the erroneous data, requesting a retransmission from the disk drive, and waiting for new data to be read and transferred by the disk drive. The host computer saves time and can perform other tasks during this saved time. The present invention also reduces the bandwidth taken up by the transmissions, retransmissions and CRC check messages on the SCSI bus.

One aspect of the present invention involves a system for comparing any errors detected by an ECC unit with any errors detected by a CRC unit in a sector of bytes read from a disk in a disk drive. This system comprises an ECC unit, a CRC unit, a buffer unit and a disk drive controller. The ECC unit detects and corrects errors in the sector of bytes. The CRC unit checks the detected errors made by the error correction unit before the data in the sector is transmitted to a host computer. The CRC unit preferably receives the sector of bytes at the same time the ECC unit receives the sector of bytes. The buffer unit temporarily stores at least a portion of the sector of bytes read from the disk, and implements the corrections by the ECC unit to the sector of bytes. The disk drive controller controls the transmission of the sector of bytes from the buffer unit to the host computer. The disk drive controller discards the current sector of bytes within the buffer unit and attempts another read operation of the same sector if the errors found by the CRC unit do not match the errors found by the ECC unit.

Another aspect of the present invention involves a method of checking any errors detected by an ECC unit in a sector of bytes read from a disk in a disk drive. This method involves reading the sector of bytes into a CRC unit and an ECC unit, generating a CRC residue from data bytes within the sector, and generating an ECC residue from the sector. The CRC unit compares any error locations and error values found by the CRC unit with any error locations and error values found by the ECC unit. The method further involves discarding the current sector read by the disk drive, without sending it to a host computer, and attempting another read operation of the same sector if the error locations or error values detected by the CRC unit do not match the error locations or error values detected by the ECC unit.

DETAILED DESCRIPTION OF THE PREFERRED EMBODIMENTS

Figure 1:
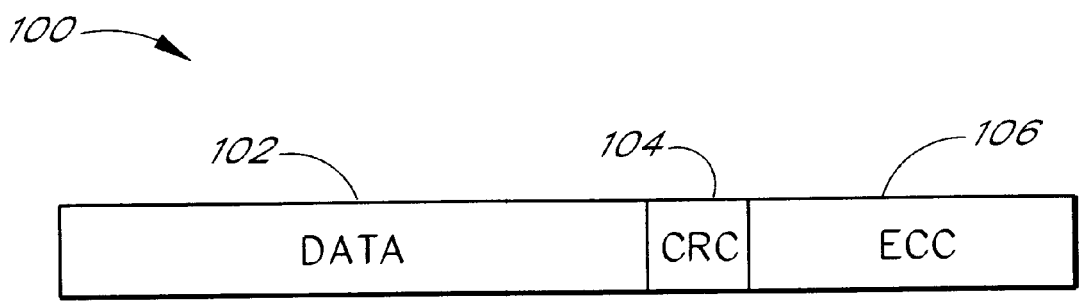
FIG. 1 illustrates a sector of bytes in accordance with a preferred embodiment of the present invention.

The present invention relates to a circuit and method for performing a CRC check before a disk drive controller reads the contents of a buffer unit and transfers them to a host computer. FIG. 1 illustrates a sector 100 of bytes in accordance with a preferred embodiment of the present invention. Each byte contains eight bits. In a preferred embodiment, the data portion 102 of the sector contains 516 bytes, which comprises four bytes of logical block address (LBA) and 512 data bytes. The CRC portion 104 contains two to four bytes and is generated from the data portion 102 using conventional methods. The ECC portion 106 contains 24 to 40 bytes and is generated from the data portion 102 and the CRC portion 104 using conventional methods. The circuit and method are configurable to sectors of various sizes. The specific byte lengths of the data portion 102, CRC portion 104 and ECC portion 106 do not affect the functionality of the present circuit and method. The circuit and method may be adapted to use sectors of different data, CRC and ECC byte lengths.

In a preferred embodiment, the ECC bytes are generated from a four-way interleave of the data 102 and CRC bytes 104. The purpose of interleaving is to correct for burst errors. In a four-way interleave, the data and CRC bytes are counted off in groups of four. In a preferred embodiment, the bytes are counted off from right (i.e. the end) of the sector to the left (i.e. the beginning) of the sector. The first byte at the right of the sector 100 and every fourth byte thereafter (i.e. the first byte, the fifth byte, the ninth byte, etc. from right to left) is grouped together to form a first interleave, which is used by the disk drive controller to generate a first ECC block. The second byte from the right (end) of the sector 100 and every fourth byte thereafter (i.e. the second byte, the sixth byte, the tenth byte, etc.) is grouped together to form a second interleave, which is used to generate a second ECC block. The third byte from the right (end) of the sector 100 and every fourth byte thereafter (i.e. the third byte, the seventh byte, the eleventh byte, etc.) of the sector 100 is grouped together to form a third interleave, which is used to generate a third ECC block. The fourth byte from the right (end) of the sector 100 and every fourth byte thereafter (i.e. fourth byte, eighth byte, twelfth byte, etc.) of the sector 100 is grouped together to form a fourth interleave, which is used to generate a fourth ECC block. The count-off does not necessarily have to start from the right to the left in the sector 100. In other embodiments, the interleave sequence may start from the left or in any other ordered sequence.

From these four interleaves, the disk drive controller 126 generates four corresponding ECC blocks. In one embodiment with 40 ECC bytes, each ECC block is 10 bytes long. Each ECC block is used to detect and correct the errors in the interleave associated with that particular ECC block. In another embodiment, the disk drive 110 uses three interleaves. An ECC generated from three or four interleaves can correct up to 20 bytes.

Figure 2:
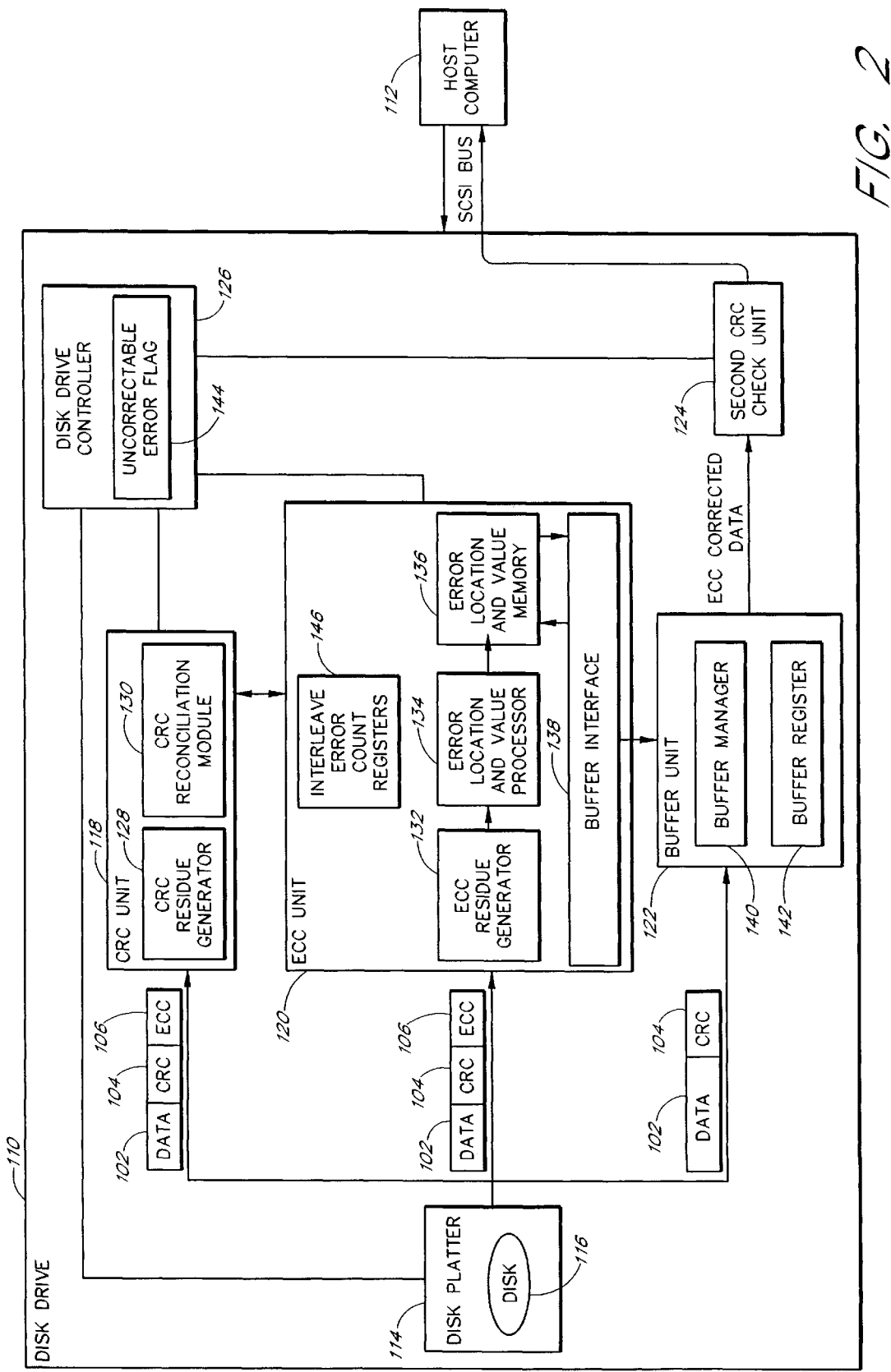
FIG. 2 is a block diagram of a host computer in communication with a disk drive in accordance with a preferred embodiment of the present invention.

FIG. 2 is a block diagram of a host computer 112 in communication with a disk drive 110 in accordance with a preferred embodiment of the present invention. The disk drive 110 communicates with the host 112 across a bus. In one embodiment, the bus is a Small Computer Systems Interface (SCSI) bus. The disk drive 110 comprises at least one disk platter 114, a CRC unit 118, an ECC unit 120, a buffer unit 122, a disk drive controller 126, and a second CRC check unit 124. The CRC unit 118, ECC unit 120 and second CRC check unit 124 are preferably independent circuits. The CRC unit 118 comprises a CRC residue generator 128 and a CRC reconciliation module 130. As used here, 'residue' is synonymous with 'syndrome'. In a preferred embodiment, the CRC unit 118 is implemented using a state machine and one or more shift registers. The ECC unit 120 comprises an ECC residue generator 132, a plurality of interleave error count registers 146, an error location and value processor 134, an error location and value memory 136 and a buffer interface 138. The buffer unit 122 comprises a buffer manager 140 and a buffer register 142. The disk drive controller 126 includes at least one uncorrectable error flag 144.

The use and operation of the disk drive 110 will now be described with reference to FIG. 2. The disk drive controller 126 initiates a read operation, and the data 102, CRC 104, and ECC 106 portions of a sector 100 are independently read into both the CRC unit 118 and the ECC unit 120. The data portion 102 and the CRC portion 104 of the sector 100 are also read into the buffer unit 122. The order of reading the bytes of a sector 100 begins with the data bytes 102, then the CRC bytes 104 and finally the ECC bytes 106. In FIG. 2, the leftmost byte of the data portion 102 is read first.

After the data 102, CRC 104 and ECC 106 bytes are read into the ECC unit 120, the ECC residue generator 132 uses the data 102, CRC 104 and ECC 106 bytes to generate four ECC residues, one for each interleave. In another embodiment, three interleaves are used and the ECC residue generator 132 generates three ECC residues. The total number of bytes of the generated ECC residues is the same as the original ECC portion 106 stored in the sector 100. For example, if the ECC portion 106 is 40 bytes long, the total number of ECC residue bytes is also 40 bytes long. If an ECC residue contains all zeroes, then there are no errors detected by the ECC unit 120 in the interleave associated with that particular ECC block.

If the ECC residues do not contain all zeroes, the ECC unit 120 informs the buffer unit 122 of what the errors are and where the errors are located. Specifically, the error location and value processor 134 uses the ECC residues to determine the location and 'mask' value of any found errors. The error location is one byte long and represents an offset from the end of a sector 100. The mask value is one byte in length and is used to correct an erroneous data or CRC byte. The error location and value processor 134 processes the errors one interleave at a time because each ECC block is associated with one interleave. The error location and value processor 134 finishes processing the errors in one interleave before starting to process the errors for another interleave.

The error location and value processor 134 outputs a list of error locations and mask values for each interleave, one interleave at a time, to the error location and value memory 136. The error location and value memory 136 stores this information. In a preferred embodiment, this error location and value memory 136 is a dual-port memory with an input, two address lines and two data lines. The dual ports allow the buffer interface 138 and the CRC reconciliation module 130 to read the error location and value memory 136 independently at their own respective speeds. Thus, both the buffer interface 138 and the CRC reconciliation module 130 may be reading from the memory 136 at the same time without interference.

Figure 5:
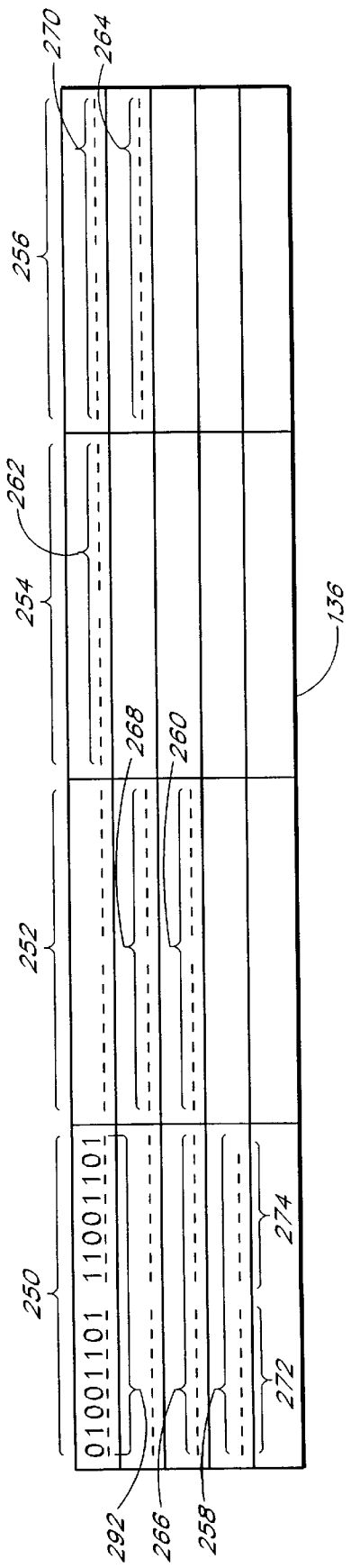
FIG. 5 illustrates the sample contents of an error location and value memory module within the disk drive depicted in FIG. 2.

FIG. 5 illustrates the sample contents of the error location and value memory 136. The error location and value memory 136 contains four error entry blocks 250, 252, 254, 256, one block for each of the four interleaves. For example, the first block 250 corresponds to all errors found in the first interleave. In the preferred embodiment, the last error entry on the bottom of each of the four blocks 250, 252, 254, 256 represents the earliest erroneous byte found in that interleave. For example, the location and error value of the first erroneous byte found by the ECC unit 120 in the first interleave is initially stored in the first error entry space 292 of the first interleave error block 250. If the ECC unit 120 finds three more erroneous bytes in the first interleave, the first erroneous byte entry is pushed down until it reaches the fourth error entry space 258. This 'push down' principle applies to all four interleave error entry blocks 250, 252, 254, 256.

Each error entry in a block 250, 252, 254, 256 is two bytes long—the first byte contains the error location and the second byte contains the mask value. For example, in the last error entry 258 of the first interleave error entry block 250, the first eight bits 272 represent an error location and the second eight bits 274 represent a mask value used to correct the erroneous byte.

In the preferred embodiment, the size of the error location and value memory 136 is preferably 40 bytes because a 40-byte ECC generated from four interleaves can correct up to 20 bytes of data (and CRC) in a 512-byte data block. Because each erroneous byte is represented by two bytes (one for location and one for the mask value), 40 bytes are required. Thus, the maximum size of the error location and value memory 136 needed for a 40-byte ECC with four interleaves is 40 bytes. This is shown by FIG. 5. Any extra memory space will not be used and is inefficient. In another embodiment, where an ECC shorter than 40 bytes is used, the memory size may be fewer than 40 bytes because a shorter ECC detects less erroneous bytes.

Figure 3:
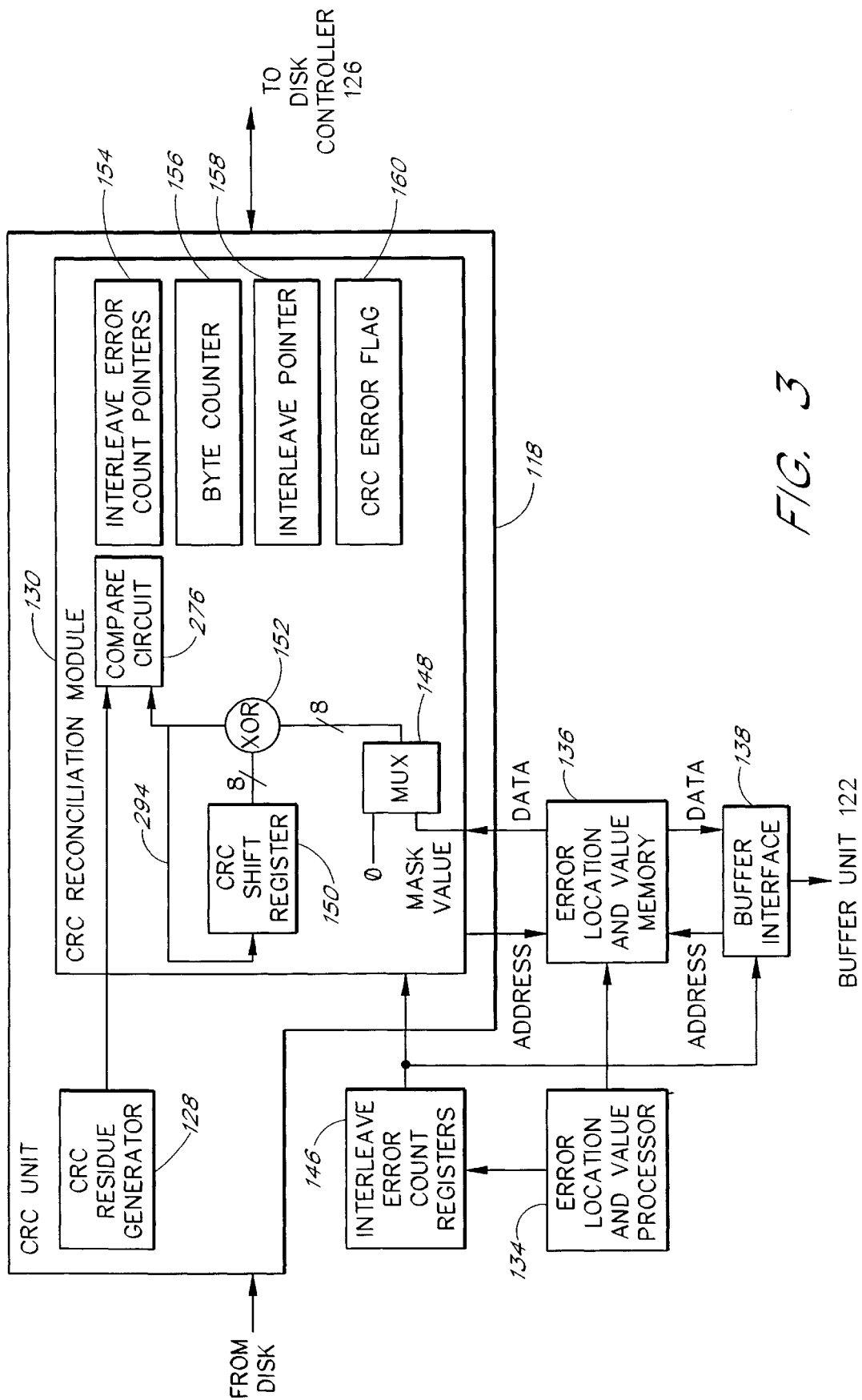
FIG. 3 is a block diagram of various internal units of the disk drive depicted in FIG. 2.

In FIGS. 2 and 3, a set of interleave error count registers 146 in the ECC unit 120 keeps track of how many error entries are stored in the error location and value memory 136 for each interleave. In a preferred embodiment, there are four interleaves and thus four corresponding interleave error count registers 146. For example, the first interleave error count register stores the number of erroneous bytes in the first interleave. The interleave error count registers 146 are read by both the buffer interface 138 and the CRC reconciliation module 130, as shown by FIG. 3. In another embodiment, the interleave error count registers 146 may be within the CRC unit 118 instead of the ECC unit 120.

Similar to the error location and value processor 134, the buffer interface 138 processes the errors one interleave at a time because each ECC block is associated with one interleave. The buffer interface 138 finishes processing the errors in one interleave before starting to process the errors for another interleave. The buffer interface 138 reads the error location and value memory 136 and translates the error locations to actual memory locations. The buffer manager 140 uses the memory locations to correct the erroneous byte(s).

To correct the erroneous byte, the buffer manager 140 performs an exclusive OR operation between the erroneous byte and the mask value associated with that erroneous byte. For example, if an original data byte stored on the disk platter 114 is 00000000, and the disk drive 110 reads the data byte as 00010000, then there is an error in the fourth bit from the left. The corresponding mask value for this particular byte would be 00010000. To correct this byte, the buffer interface 138 in the ECC unit 120 sends a message to the buffer manager 140 to exclusive-OR the mask value 00010000 with the erroneous byte 00010000. The result after the exclusive-OR operation would be 00000000, which is the same as the original data byte. The buffer manager 140 replaces the erroneous byte with this value.

At the same time that the sector 100 is read into the ECC unit 120, the data 102 and CRC 104 bytes are read into the CRC unit 118. There is a byte counter 156 within the CRC unit 118 which informs the CRC residue generator 128 when the last CRC byte is read into the CRC unit 118. After the data 102 and CRC 104 bytes are read into the CRC unit, the CRC residue generator 128 uses the data 102 and CRC 104 bytes to generate a CRC residue (or syndrome) using conventional methods. The generated CRC residue is the same byte length as the original CRC portion 104 stored in the sector 100. For example, if the CRC portion 104 is two bytes long, the CRC residue is also two bytes long. Using standard techniques, the CRC unit 118 uses the residue to detect errors in the data portion 102.

In a preferred embodiment, the second CRC check unit 124 performs another CRC check on the data bytes 102 while the data bytes 102 are sent to the host 112. This second CRC check unit 124 checks to see if the buffer unit 122 is functioning properly. If the buffer unit 122 is malfunctioning or damaged, the second CRC check unit will detect errors caused by the buffer unit 122.

In general, the CRC unit 118 must approve the read data before the read data is sent to the host 112. If both the ECC unit 120 and CRC unit 118 do not detect any errors in the data 102, then the disk drive controller 126 transmits the sector 100 to the host computer 112. If the CRC unit 118 and the ECC unit 120 disagree on whether any errors are detected in the sector 100 or what the specific detected errors are, the disk drive controller 126 will discard the read sector 100. No erroneous data is sent to the host 112, and the host 112 does not try to process erroneous data. The disk drive controller 126 will attempt another read operation of the same data sector 100 from the disk 116. This eliminates the need for the host 112 to discard the erroneous data and request a retransmission.

Figure 6:
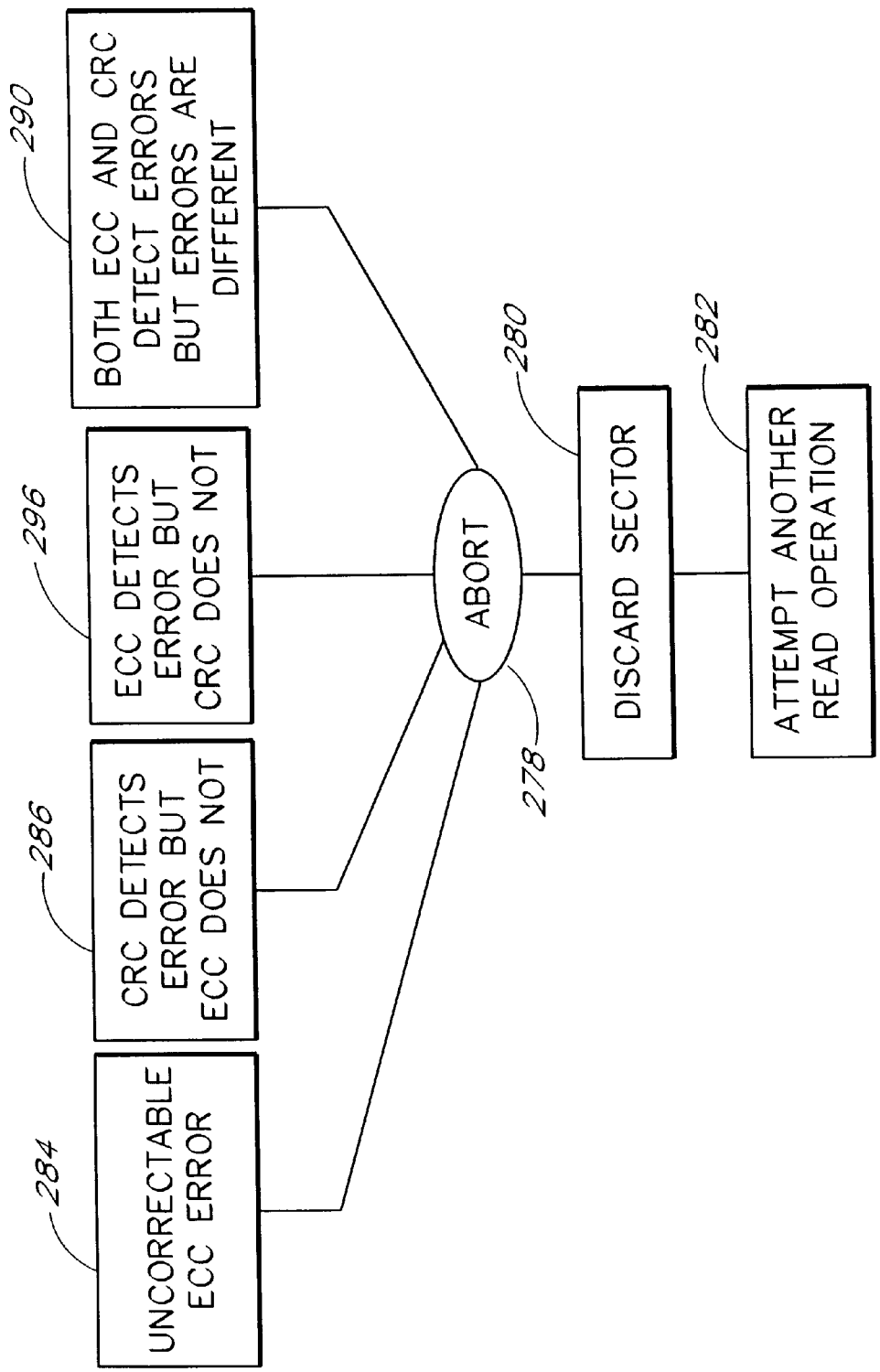
FIG. 6 illustrates the events which cause the disk drive depicted in FIG. 2 to abort a read data operation.

FIG. 6 illustrates some of the events which cause the disk drive 110 to abort the current sector and attempt to read the same sector again from the disk platter 114. In one event 284, the ECC unit 120 detects an uncorrectable error in the data 102. An uncorrectable error flag 144 is then set in the disk drive controller 126 to cause an abort 278. The disk drive controller 126 discards the sector 100 in a function 280, and attempts another read operation of the same sector from the disk 116 in a function 282. An example of an uncorrectable error is where the ECC detects more than 20 byte errors in the sector. Because a 40-byte ECC generated from 4 interleaves can only correct up to 20 erroneous bytes, a sector with more than 20 bytes in error is uncorrectable.

If, as illustrated by an event 286, the CRC unit 118 detects at least one error in the data 102 but the ECC unit 120 does not, then the uncorrectable error flag 144 is set in the disk drive controller 126 to cause an abort 278. The disk drive controller 126 discards the sector 100 in the function 280 and attempts another read operation of the same sector from the disk 116 in the function 282.

If, as illustrated by an event 296, the ECC unit 120 detects and corrects at least one error in the data 102, and the CRC unit 118 does not detect an error, a miscorrection has occurred, and an abort 278 is initiated. The disk drive controller 126 discards the sector 100 in the function 280 and attempts another read operation of the same sector from the disk 116 in a function 282.

If, as illustrated by an event 290, both the CRC unit 118 and the ECC unit 120 detect at least one error, but the detected errors are not the same, then the uncorrectable error flag 144 is set in the disk drive controller 126 to cause an abort 278. The disk drive controller 126 discards the sector 100 in the function 280 and attempts another read operation of the same sector from the disk 116 in the function 282. For example, if the CRC unit 118 detects an error in the first data byte and the ECC unit 120 detects an error in the four-hundredth data byte, then the detected errors are not the same.

A preferred embodiment of the present invention is adapted to process all four situations. This preferred embodiment is ideally suited to process the two situations which are illustrated by the events 286, 290.

The use and operation of the CRC reconciliation module 130 in FIG. 2 will now be described with reference to FIGS. 3, 4 and 5. FIG. 3 is a block diagram of the CRC unit 118 and other components of the disk drive 110. The CRC reconciliation module 130 comprises a CRC shift register 150 with a feedback 294, a MUX 148, a compare circuit 276, four interleave error count pointers 154 (each 1 byte long), a byte counter 156, an interleave pointer 158 and a CRC error flag 160. As shown in FIG. 3, the CRC reconciliation module 130 reads information from the CRC residue generator 128, the interleave error count registers 146 and the error location and value memory 136.

Figure 4:
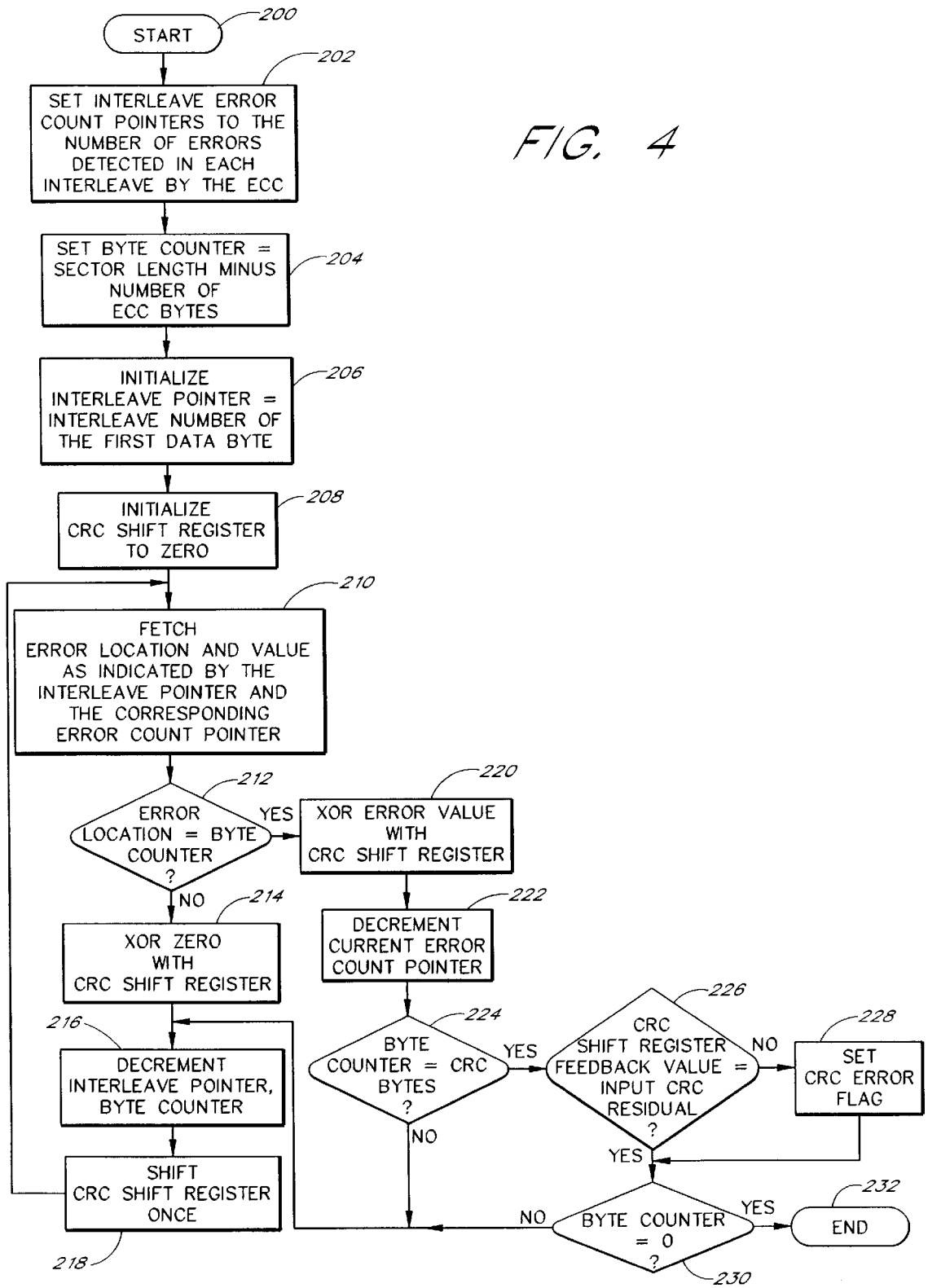
FIG. 4 is a flow chart of the acts performed by a CRC reconciliation module contained within the disk drive depicted in FIG. 2.

FIG. 4 is a flow chart of the acts performed by the CRC reconciliation module 130. The CRC reconciliation module 130 may be implemented by a state machine to perform the acts in the flow chart of FIG. 4. In general, the CRC reconciliation module 130 checks to see if the error location and mask values found by the ECC unit 120 are correct. The CRC reconciliation module 130 reads the error location and value memory 136 and compares these error entries with the CRC residue generated by the CRC residue generator 128. The CRC reconciliation module 130 detects any miscorrections made by the ECC unit 120. This significantly reduces the probability of miscorrections as seen by the host computer 112.

Specifically, at the end of the error correction process performed by the ECC unit 120, the ECC unit 120 sends a message to the CRC unit 118 that the ECC unit 120 is done. The CRC reconciliation module 130 begins its reconciliation process. This is represented by the 'start' oval 200 in FIG. 4. In a block 202, the CRC reconciliation module 130 reads the interleave error count registers 146 to determine the number of errors found by the ECC unit 120. The interleave error count registers 146 inform the CRC reconciliation module 130 of how many error entries need to be read from the error location and value memory 136. The CRC reconciliation module 130 stores this information in its four interleave error count pointers 154. Unlike the interleave error count registers, which are static, the interleave error count pointers 154 are dynamic and can be decremented by the CRC reconciliation module 130.

Next, the CRC reconciliation module 130 proceeds to block 204 and sets the byte counter 156 equal to the sector length minus the number of ECC bytes 106. Thus, the disk drive 110 is configurable to process sectors of various lengths. The byte counter 156 keeps track of which byte in the sector 100 that the CRC reconciliation module 130 is currently processing. In a preferred embodiment, the entire sector length is between 542 to 560 bytes. The CRC reconciliation module 130 only takes into consideration the data bytes 102 and the CRC bytes 104. For example, if the combined data bytes 102 and the CRC bytes 104 are 520 bytes long, then the byte counter 156 is set to '520'. This value '520' is used in the examples below.

The CRC reconciliation module 130 proceeds to a block 206 and initializes the interleave pointer 158 to the interleave number of the first data byte. The first data byte at the left end may be in any one of the four interleaves, depending on which order in which the disk controller 126 organized the interleaves. For example, if there are 520 bytes of data and CRC, and the four interleaves are organized from right to left as described above, the first data byte at the left end will be in the fourth interleave.

In a block 208, the CRC shift register 150 is initialized to zero. The structure of the CRC shift register 150 is substantially similar to a conventional CRC shift register as used in the CRC residue generator 128. A conventional CRC shift register is used to generate a CRC residue and to detect errors in a sector. The CRC shift register 150 in the CRC reconciliation module 130 is used to check the error mask values found by the ECC unit 120. The CRC shift register 150 is the same length as the original CRC portion 104, which is two to four bytes long. The structure of the feedback 294 is defined by a standard CRC generator polynomial.

In a block 210, the CRC reconciliation module 130 fetches a particular error location and value, as indicated by the interleave pointer 158 and the interleave error count pointer 154, from the error location and value memory 136. The interleave pointer 158 in FIG. 3 indicates which column in FIG. 5 is being accessed by the CRC reconciliation module 130. The interleave error count pointer 154 in FIG. 3 indicates which row in FIG. 5 is being accessed. For example, as described above, if there are 520 bytes of data and CRC, and the four interleaves are organized from right to left, the first data byte at the left end will be in the fourth interleave. In the sample error location and value memory 136 illustrated in FIG. 5, there are two error entries in the fourth interleave error entry block 256. Thus, the interleave pointer 158 equals '4' and the interleave error count pointer 154 equals '2'. The CRC reconciliation module 130 fetches the second error entry 264 in the fourth column 256 in FIG. 5. As described above, the earliest error entries (closest to the left of the sector 100) are closest to the bottom of each column because of the 'push down' memory principle.

Once the CRC reconciliation module 130 has fetched an error entry from the error location and value memory 136, the CRC reconciliation module 130 first checks the error location part of the error entry (each error entry in the memory 136 has an error location and an error value). In a block 212, the CRC reconciliation module 130 checks to see if the error location of the particular error entry, as indicated by the interleave pointer 158 and the interleave error count pointer 154, is equal to the current location value stored in the byte counter 156. In the example above, the byte counter 156 is set to '520' for the CRC reconciliation module 130 to look at the first data byte from the left. The first data byte is in the fourth interleave, and the interleave pointer 158 is set to '4'. The interleave error count pointer 154 for the fourth interleave indicates there are two error entries. The CRC reconciliation module 130 fetches the second error entry 264 in the fourth interleave error entry block 256 in FIG. 5. The CRC reconciliation module 130 checks the error location (first eight bits) of this error entry 264. If this error location does not match the current value in the byte counter 156, then the CRC reconciliation module 130 knows that the ECC unit 120 did not find an error in the first data byte. Thus, the CRC reconciliation module 130 moves on to a block 214.

In the block 214, the CRC reconciliation module 130 enters a '0' in the MUX 148 (FIG. 3). The CRC reconciliation module 130 passes a '0' through an exclusive-OR (XOR) gate 152 which also receives the output of the CRC shift register 150. The output 294 of the exclusive-OR gate 152 feeds back into the CRC shift register 150 via the feedback 294. In a block 216, the CRC reconciliation module 130 decrements the byte counter 156 and the interleave pointer 158 by one. The byte counter 156 is decremented by '1' to '519' because the CRC reconciliation module 130 will check the second data byte from the left in the sector 100. After decrementing, the interleave pointer 158 is now equal to '3' because the bytes in the sector 100 are counted off from right of the CRC bytes to left as they are put into the four interleaves. The next time the interleave pointer 158 is decremented, it changes from '3' to '2' to '1' back to '4' to '3' to '2' to '1' and repeats. This decrementing repeats until the byte counter equals '0' in block 230.

Unlike the buffer interface 128 in the ECC unit 120, the CRC residue generator 128 and the CRC reconciliation module 130 do not process errors one interleave at a time because the CRC bytes 104 and the CRC residue is not generated from interleaves. The CRC residue is generated from the whole data portion 102. The CRC residue generator 128 and the CRC reconciliation module 130 process errors serially from left to right, starting with the first data byte from the left.

In a block 218, the CRC reconciliation module 130 cyclicly shifts the CRC shift register 150 once in accordance with standard CRC techniques. After the CRC reconciliation module 130 finishes analyzing any errors found by the ECC unit 120 in the first data byte, the module 130 moves onto the second data byte in the data portion 102. To examine the second data byte in the data portion 102, the CRC reconciliation module 130 must look for errors found by the ECC unit 120 in the next interleave. Thus, the CRC reconciliation module 130 steps through each interleave error entry block 250, 252, 254, 256 in the error location and value memory 136.

The CRC reconciliation module 130 returns to the block 210, where the CRC reconciliation module 130 fetches the next error location and value. Specifically, following the example above, the interleave pointer 158 is now equal to '3'. The interleave error count pointer 154 for the third interleave is now equal to '1' because there is one error entry 262 in the third interleave error entry block 254 of the sample error location and value memory 136 in FIG. 5. The CRC reconciliation module 130 fetches the single error entry 262 in the third interleave error entry block 254 shown in FIG. 5. In the block 212, the CRC reconciliation module 130 compares the current value in the byte counter 156, which is '519', with the error location part (first byte) of the error entry 262. If the current value in the byte counter 156 is equal to the error location part of the error entry 262, i.e., both are equal to '519', this means that the ECC unit 120 found an error in this second data byte. The CRC reconciliation module 130 proceeds to a block 220, where the CRC reconciliation module 130 passes the error mask value (second byte) of the error entry 262 through the exclusive-OR gate 152 with the output of the CRC shift register 150. As discussed above, this output is fed back into the CRC shift register 150 via the feedback 294 using conventional CRC techniques.

The feedback of the error mask value and the output of the CRC shift register 150 back into the CRC shift register 150 generates a 'CRC residue' in the CRC shift register 150. This CRC residue, generated and stored in the CRC shift register 150 in the CRC reconciliation module 130, now accounts for an error found in the second data byte by the ECC unit 120.

As the CRC reconciliation module 130 proceeds through the data bytes, the CRC reconciliation module 130 will continue to pass error mask values from the ECC unit's error location and value memory 136 through the exclusive-OR gate 152 with the output of the CRC shift register 150. The output from the exclusive-OR gate 152 will continue to be fed back into the CRC shift register 150. Thus, the CRC residue generated by the CRC shift register 150 will eventually account for all the data byte errors found by the ECC unit 120. This process will continue until the byte counter 156 reaches the end of the data byte portion 102 and the beginning of the CRC portion 104.

Unlike the CRC residue generated by the CRC residue generator 128, the CRC residue in the CRC shift register 150 is not generated from the data bytes 102 using a conventional cyclic redundancy check generator polynomial. The CRC residue in the CRC shift register 150 is generated from the error mask values found by the ECC unit 120 using an ECC residue. The CRC residue in the CRC shift register 150 is generated without the original data bytes 102. This allows a later comparison between the CRC residue generated by the CRC residue generator 128 and the 'CRC residue' generated by CRC reconciliation module 130 from the error mask values found by the ECC unit 120.

In a block 222, the current value of the interleave error count pointer 154 for the third interleave is decremented by one and changes from '1' to '0'. This means there are no more error entries in the third interleave error entry block 254 left to be processed by the CRC reconciliation module 130. The CRC reconciliation module 130 decrements the current interleave error count pointer 154 each time the CRC reconciliation module 130 reaches the block 212 and proceeds to the blocks 220 and 222, when the location of an error entry matches the present value stored in the byte counter 156. The interleave error count pointer 154 is decremented each time the CRC reconciliation module 130 reaches the block 222 until one of two things occurs. In one situation, there are no more error entries in the interleave error entry blocks 250, 252, 254, 256 of the error location and value memory 136 for the CRC reconciliation module 130 to process, i.e., when the interleave error count pointer 154 for that particular interleave reaches '0'. In another situation, the byte counter 156 reaches the end of the CRC bytes, i.e., when the byte counter 156 equals '0'. In this latter situation, there may be more error entries in the error location and value memory 136, but these error entries relate to errors found in the ECC bytes 106. The CRC reconciliation module 130 does not check for miscorrections in the ECC bytes 106.

In a block 224, the CRC reconciliation module 130 compares the current value in the byte counter 156, which is '519', with the location of the first CRC byte. The location of the first CRC byte in the example above is '4' because out of 520 combined data and CRC bytes, the first four bytes are CRC bytes and the next 516 bytes are data bytes when counting from right to left. Because the byte counter 156 equals '519' and this is not equal to '4', the CRC reconciliation module 130 proceeds to block 216 and decrements the interleave pointer 158 to '2' and decrements the byte counter 156 to '518'. The CRC shift register 150 cyclicly shifts once for the next byte in block 218, and the CRC reconciliation module 130 returns to the block 210.

In the block 210, the interleave error count pointer 154 for the second interleave is '3' because there are three error entries in the second column 252 of the sample error location and value memory 136 in FIG. 5. The CRC reconciliation module 130 fetches the error location and value from the third error entry 260 in the second interleave error entry block 252. In the block 212, the CRC reconciliation module 130 compares the current value of the byte counter 156 with the error location (first 8 bits) of the error entry 260. If the value in the byte counter 156 matches the error location of the error entry 260, then the ECC unit 120 detected an error in the third data byte. If the byte counter 156 does not match the error location of the error entry 260, then the ECC unit 120 did not detect an error in the third data byte.

This process described by blocks 210 through 224 repeats itself until the byte counter 156 in the CRC reconciliation module 130 reaches the first CRC byte. In other words, the byte counter 156 equals '4'. At this point, the feedback value of the CRC shift register 150 accounts for all the mask values of the data byte errors found by the ECC unit 120. In a block 226, the CRC reconciliation module 130 uses the compare circuit 276 of FIG. 3 to compare the feedback value of the CRC shift register 150 with a CRC residue input from the CRC residue generator 128. The CRC residue input from the CRC residue generator 128 accounts for all the data byte errors found by the CRC residue generator 128 using standard CRC methods. In a block 226, the CRC reconciliation module 130 compares any errors in the data bytes found by the CRC residue generator 128 with any errors found by the ECC unit 120.

If the two CRC residues are equal, then, in a block 230, the CRC reconciliation module 130 checks to see if the byte counter 156 is equal to '0'. The byte counter 156 is equal to '0' when the byte counter 156 has reached the end of the data and CRC bytes of the sector 100. If the byte counter 156 is not equal to '0', then the CRC reconciliation module 130 continues to process the CRC bytes, as described in blocks 210 through 226.

If the two CRC residues being compared are not equal, as in a block 226, then the CRC reconciliation module 130 sets a CRC error flag 160 in block 228. This CRC error flag 160 immediately alerts (or interrupts) the disk drive controller 126 that the errors found by the CRC unit 118 are inconsistent with the errors found by the ECC unit 120. In a preferred embodiment, this CRC error flag 160 is located within the CRC reconciliation module 130 and is read by the disk drive controller 126. In another embodiment, the CRC error flag 160 is located within the disk drive controller 126.

When the CRC error flag 160 is set, the disk drive controller 126 aborts the read operation, discards the current sector 100, and attempts another read operation of the same sector 100 from the disk 116.

In a preferred embodiment, there are four CRC bytes. With four bytes of CRC, the CRC residue generator 128 generates four residues of one byte in length. Thus, there are four residues, one residue for each of the four bytes of CRC. The compare circuit 276 compares the four CRC residues generated by the CRC residue generator 128 with the four residues generated by the CRC shift register 150, one at a time. This process is shown in blocks 224, 226 and 230. There may be detected errors in the CRC bytes themselves.

In the block 230, the CRC reconciliation module 130 checks to see if the byte counter 156 is equal to '0'. If the byte counter 156 is not equal to '0', then the CRC reconciliation module continues to process the CRC bytes, as described in blocks 210 through 226. If the byte counter 156 is equal to '0', then the CRC reconciliation process ends in block 232.

During the time when the CRC reconciliation module 130 is comparing detected errors, the disk drive controller 126 may be sending one or more signals to the host computer saying that the disk drive 110 is not ready to transmit data yet. Alternatively, the host computer 112 could be polling the disk drive 110 for a ready-to-transmit-data signal.

While the CRC reconciliation module 130 is checking the errors detected and corrected in the sector of bytes by the ECC unit 120, the ECC unit 120 may begin processing another sector of bytes from the disk platter 114. Specifically, as soon as error location and value processor 134 writes the detected error locations and values into the error location and value memory 136, the ECC residue generator 132 may read another sector from the disk platter 114. The ECC residue generator 132 generates an ECC residue for this next sector. Thus, the ECC residue generator 132 does not have to wait until the CRC unit is done comparing errors found by the ECC unit and the CRC unit before processing a second sector. This results in an efficient, continuous, 'real time' read operation in the disk drive. When the CRC reconciliation module 130 finishes its analysis, the error location and value processor 134 writes the detected error locations and values for this next sector into the error location and error memory 136. The contents of the memory 136 are overwritten each time a new sector is processed by the ECC unit 120.

The present invention reduces the amount of erroneous data sent to the host computer 112. The host computer 112 does not have to discard erroneous data bytes, send a request to the disk drive to reread the data bytes from the disk platter and retransmit the data bytes, and wait for new data to be read and transferred. The host computer 112 saves time and can perform other tasks during this saved time.

The present invention also reduces the bandwidth taken up by the transmissions, retransmissions and CRC check messages on the SCSI bus. Furthermore, the present invention prevents breakdowns in software applications currently being run by host computers that cannot process the incorrect data.

While embodiments and applications of this invention have been shown and described, it will be apparent to those skilled in the art that various modifications are possible without departing from the scope of the invention. It is, therefore, to be understood that within the scope of the appended claims, this invention may be practiced otherwise than as specifically described.

What is claimed is:

1. A system for comparing any errors detected by an error correction code (ECC) unit with any errors detected by a cyclic redundancy check (CRC) unit in a sector of bytes read from a disk in a disk drive comprising:
    an ECC unit which detects and corrects errors in the sector of bytes read from the disk;
    a CRC unit which detects errors in the sector of bytes read from the disk and compares any errors detected by the ECC unit with any errors detected by the CRC unit, before the data in the sector is transmitted to a host computer;
    a buffer unit which temporarily stores at least a portion of the sector of bytes read from the disk, said buffer unit implementing the corrections by the ECC unit to the sector of bytes; and
    a disk drive controller which controls the transmission of the sector of bytes from the buffer unit to the host computer, said disk drive controller aborting the current sector of bytes within the buffer unit and attempting another read operation if the errors detected by the CRC unit do not match the errors detected by the ECC unit.

2. The system of claim 1, wherein said CRC unit receives the sector of bytes from the disk at approximately the same time the ECC unit receives the sector of bytes.

3. The system of claim 1, wherein the ECC unit begins to process another sector of bytes from the disk while the CRC unit is comparing any errors detected by the ECC unit with any errors detected by the CRC unit.

4. The system of claim 1, wherein the sector of bytes comprises:
    data bytes;
    CRC bytes; and
    ECC bytes.

5. The system of claim 1, further comprising a second CRC check unit which performs another CRC check on the data bytes in the sector while the data bytes are sent to the host, said second CRC check unit checking to see if the buffer unit is functioning properly.

6. The system of claim 1, wherein the sector of bytes is organized into a plurality of interleaves for generating a plurality of ECC residues, each of said ECC residues corresponding to only one interleave.

7. The system of claim 6, wherein the sector of bytes is organized into four interleaves with each interleave used to generate its own ECC residue.

8. The system of claim 6, wherein the ECC unit comprises:
    an ECC residue generator for generating a residue for each interleave of bytes;
    an error location and value processor for deriving the location and mask value of each detected error from the ECC residue generated by the ECC residue generator;
    an error location and mask value memory for storing the location and mask value of each detected error in each interleave derived by the error location and value processor;
    a plurality of interleave error count registers for keeping track of the number of errors detected by the ECC unit in each interleave; and
    a buffer interface for correcting the detected erroneous bytes in the buffer unit using the error entries in the error location and value memory.

9. The system of claim 8, wherein the ECC residue generator reads another sector of bytes from the disk and begins to generate a residue for this second sector of bytes while the CRC unit is comparing any errors detected by the ECC unit with any errors detected by the CRC unit in the first sector of bytes.

10. The system of claim 8, wherein the error location and mask value memory comprises two-byte error entries, a first byte of each error entry representing the error location, and a second byte of each entry representing the error mask value.

11. The system of claim 8, wherein the buffer interface corrects an erroneous byte in the sector by passing the erroneous byte and its error mask value through an exclusive-OR gate and replacing the erroneous byte with the output from the exclusive-OR gate.

12. The system of claim 8, wherein the error location and mask value memory is a dual-port memory capable of being read by two different units at a time.

13. The system of claim 1, wherein the CRC unit comprises:
    a CRC residue generator which generates a CRC residue from the data bytes in the sector read from the disk, said CRC residue used to detect errors in the data bytes; and
    a CRC reconciliation module which compares the error locations and error values found by the CRC residue generator with the error locations and error values found by the ECC unit.

14. The system of claim 13, wherein the CRC reconciliation module comprises:
- a CRC shift register which generates a CRC residue which accounts for all the error values found by the ECC unit;
- a multiplexer which selects between an error mask value from the ECC unit and a '0' value;
- at least one exclusive-OR gate which feeds an input of the CRC shift register with the output of the CRC shift register exclusive-ORed with a retrieved error mask value from the ECC unit;
- a compare circuit which compares the CRC residue generated by the CRC residue generator and the CRC residue generated by the CRC shift register within the CRC reconciliation module; and
- a CRC error flag which indicates that the error locations or error values detected by the CRC unit do not match the error locations or error values detected by the ECC unit.

15. The system of claim 13, wherein the CRC reconciliation module further comprises:
- a plurality of interleave error count pointers which keep track of a number of error entries remaining for the CRC reconciliation module to process in each interleave;
- a byte counter which keeps track of which byte the CRC reconciliation module is currently processing; and
- an interleave pointer which keeps track of which interleave error block the CRC reconciliation module is currently accessing from the ECC unit.

16. The system of claim 13, wherein the CRC reconciliation module is adapted to process sectors of various lengths with variable data, CRC and ECC byte lengths.

17. A method of checking any errors detected by an error correction code (ECC) unit in a sector of bytes read from a disk in a disk drive comprising:
- reading the sector of bytes from the disk into a cyclic redundancy check (CRC) unit and the ECC unit;
- generating a CRC residue from data bytes within the sector;
- generating an ECC residue from the sector;
- comparing any error locations and error values found by the CRC unit with any error locations and error values found by the ECC unit; and
- discarding the current sector read by the disk drive, without sending it to a host computer, and attempting another read operation of the same sector if the error locations or error values detected by the CRC unit do not match the error locations or error values detected by the ECC unit.

18. The method of claim 17, further comprising:
simultaneously reading the sector of bytes into a CRC unit and an ECC unit at the same time.

19. The method of claim 17, further comprising:
reading another sector of bytes from the disk into the ECC unit and processing this second sector while the CRC unit is comparing any error locations and error values found by the CRC unit with any error locations and error values found by the ECC unit.

20. The method of claim 17, further comprising:
discarding the current sector read by the disk drive, without sending it to a host computer, and attempting another read operation of the same sector if the errors detected by the ECC unit are uncorrectable.

* * * * *